United States Patent [19]

Halstead et al.

[11] 4,364,009
[45] Dec. 14, 1982

[54] CLUTCH MECHANISM FOR TIME OF DAY WATTHOUR METER REGISTERS

[75] Inventors: Kenneth G. Halstead, Raleigh; Eugene C. Benbow, Wake, both of N.C.

[73] Assignee: Westinghouse Electric Corp., Pittsburgh, Pa.

[21] Appl. No.: 167,952

[22] Filed: Jul. 14, 1980

[51] Int. Cl.³ .................... G01R 15/08; G01R 19/16
[52] U.S. Cl. ................................. 324/116; 324/103 R
[58] Field of Search .................... 324/116, 103 R; 364/483

[56] References Cited

U.S. PATENT DOCUMENTS

| | | |
|---|---|---|
| 2,132,256 | 10/1938 | Cameron . |
| 2,139,821 | 12/1938 | Greenwood et al. . |
| 2,246,185 | 6/1941 | Pratt . |
| 2,285,882 | 6/1942 | Anderson et al. . |
| 2,830,269 | 4/1958 | Truesdell . |
| 2,997,147 | 8/1961 | Bilz . |
| 3,406,338 | 10/1968 | Benbow .......................... 324/103 R |
| 3,913,014 | 10/1975 | Halstead et al. ................ 324/103 R |
| 4,307,341 | 12/1981 | Benbow .......................... 324/103 R |

*Primary Examiner*—Ernest F. Karlsen
*Attorney, Agent, or Firm*—Robert E. Converse, Jr.

[57] ABSTRACT

A clutch mechanism for time of day watthour meter dial registers includes a clutch mechanism having a driving part continuously driven by a rotating measuring element so that it is freely rotatable when the clutch is open and a clutch driven part which is shiftable between clutch open and clutch closed positions by a lever arm which further arrests rotation of the clutch driving part during the clutch open position.

6 Claims, 4 Drawing Figures

CLUTCH MECHANISM FOR TIME OF DAY WATTHOUR METER REGISTERS

BACKGROUND OF THE INVENTION

This invention relates to a watthour dial register having a clutch mechanism for periodically uncoupling a dial indicator from a rotatable measuring element driven in response to variations of a quantity to be measured.

Dial registers are typically used in various types of meters for indicating the consumption of different quantities to be measured. In electric energy meters, a disk and shaft assembly forms a measuring element that is electromagnetically rotated at the rate of consumption of electric energy. Rotations are coupled by one or more register gear trains to clock type dial pointers which totalize the rotations for indicating kilowatthours of electric energy consumption. When measurements are to be made only during preselected time intervals, for example only during one or more periods of each day, the periodically operated dial pointers must remain uncoupled from the measuring element while it continues to rotate. Also, the dial pointers must be held against movement when uncoupled from the measuring element. The register gear trains often include a shiftable shaft which produces meshing and demeshing of a pair of gears to produce the periodic coupling and uncoupling operations. It has been found that a large number of meshing and demeshing operations provided by the reciprocally movable gear shaft causes errors and inaccuracy in the dial readings. One cause of the errors is that the meshing of a movable gear with a fixed gear gives a tooth-to-tooth error by causing rotation of the movable gear clockwise or counterclockwise as the two gears enter meshing engagement. Further, an axially movable gear will sometimes have its teeth aligned so as to hit the teeth of the fixed gear causing an instantaneous jamming condition and a resulting clockwise or counterclockwise rotation of the gears. Still further inaccuracies are produced when a braking system is used to hold an axially fixed gear train rotationally stationary in the uncoupled condition by introducing undesired gear backlash in the fixed gear train and adding to the aforementioned tooth-to-tooth meshing errors as it is engaged by an axially moving gear. Registers incorporating the aforementioned movable gear design are described in the following U.S. Pat. Nos. 2,139,821; 2,246,185; 2,132,256; 2,830,269; 2,285,882; 2,997,147; and 3,406,338.

Register gear trains of the time-of-day type also may utilize a clutch mechanism to avoid the gear meshing and demeshing error. The clutch mechanism selectively couples and uncouples the periodically operated dial pointer gearing. Many of the prior art register clutch mechanisms produce additional frictional drag or additional rotational torque loading on the rotatable measuring element while the clutch is uncoupled. The mechanical loading on the register gear trains cause them to wear excessively and substantially shorten the operational lifetime of such a register. The substantial variations and loads on the rotatable measuring element during measuring and non-measuring times of the periodically operated dial pointer can cause it to become unstable, produce excessive wear on the disk shaft bearings and substantially reduce the operational lifetime of the measuring element. One example of the aforementioned clutch type of time-of-day or on-peak off-peak type of register is described and claimed in U.S. Pat. No. 4,307,341 and assigned to the assignee of this invention. A clutch mechanism is described in the aforementioned application for watt demand meter registers and includes a clutch driving part continuously driven by a measuring element and the driving part is mounted between a clutch driven part and a clutch closing part which clamps the clutch parts together when the clutch is closed. The present invention is directed to a further improved clutch mechanism which is particularly useful in a time-of-day watthour meter register.

SUMMARY OF THE INVENTION

A time-of-day meter dial register made in accordance with this invention includes an improved gear train system and clutch mechanism for operating a first dial pointer in a continuously driven manner and for operating a second dial pointer in an intermittently driven manner and so that the second dial pointer is maintained in a braked and locked condition when not being driven. The dial register provides both continuously accumulated and periodically accumulated values of the consumption of a quantity to be measured at the first and second dial pointers. The clutch mechanism includes a driving clutch part having a fixed axial position and being freely rotatable in response to a rotatable measuring element. A clutch driven and brake part is coupled to the second dial pointer, is freely rotatable, is axially movable or shiftable for frictional engagement with the clutch driving part when in the clutch closed position and further is disengageable therefrom so as to be held in a braked condition when in the clutch open position. A pivoted lever arm has one end for shifting the clutch driven and brake part. A biased engagement between the one end of the lever arm and the shiftable clutch part provides frictional arresting of the clutch part when the clutch is in the open position to maintain the second dial pointer in place. In one preferred form, a clutch operating arrangement including the lever arm also includes a solenoid for actuating the lever arm and producing remotely controlled operation of the clutch open and closed positions.

An important feature of the invention is to provide an improved clutch mechanism for watthour dial registers that couples and uncouples a rotatable measuring element with a periodically operated dial pointer indicator so that a clutch driving part produces a low or negligible torque on the register gear train and on the measuring element coupled thereto and so that the clutch driven part is held against rotation to prevent erroneous movement of the dial pointer when uncoupled from the clutch driving part and rotatable measuring element.

DETAILED DESCRIPTION OF THE PREFERRED EMBODIMENT

Figure 1:
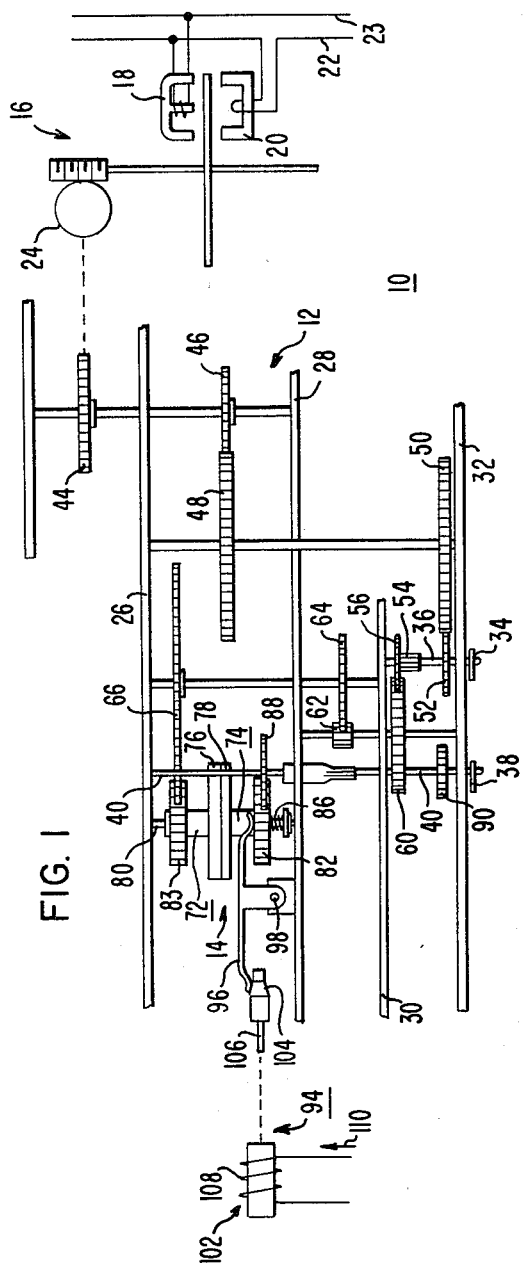
FIG. 1 is a top plan view of a portion of a time-of-day watthour meter register including an improved clutch mechanism made in accordance with the present invention and further includes a diagrammatic showing of associated parts of an electric energy meter utilizing the register.

Referring now to the drawings and more particularly to FIG. 1, an electric energy meter 10 is shown therein including a time-of-day or two-rate watthour dial register 12 including an improved clutch mechanism 14 and gearing system made in accordance with the present invention. The meter 10 includes a watthour metering movement of the induction or electromechanical type having a rotatable measuring element 16 formed by a shaft-supported conductive disk. As is understood by those skilled in the watthour meter art, the disk and shaft of the element 16 are rotated or driven electromagnetically by a voltage electromagnetic section 18 and a current electromagnetic section 20. Conductors 22 and 23 carry the voltage and current components of the electric energy quantity to be measured. The voltage and current electromagnetic sections 18 and 20 are appropriately connected to the conductors 22 and 23 to drive the measuring element 16 at a rate proportional to the rate of consumption of the electric energy quantity to be measured.

Figure 3:
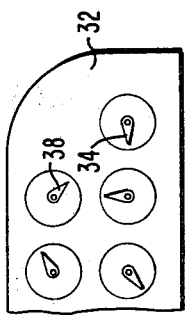
FIG. 3 is a fragmentary front elevational view of the dial register shown in FIG. 1.

In a known manner, a worm wheel 24 is driven by the shaft of the measuring element 16 to couple its rotations to a gear train system carried for rotation by a back plate 26, middle plates 28 and 30 and a front dial plate 32. A total kilowatthour pointer 34 is carried on a shaft 36 and an on-peak pointer 38 is carried on a shaft 40 at the front of the dial plate 32. As described further hereinbelow, the gear train system and clutch mechanism 14 of the register 12 directly and continuously drive the pointer 34 while the pointer 38 is driven intermittently or periodically. Typically, the pointer 38 is coupled to the measuring element 16 only during daily time periods when the electric power flowing in the conductors 22 and 23 is the highest. It is to be understood that the pointers 34 and 38 are the least significant of two sets of decade related dials, partially shown in FIG. 3, which have higher order or more significant dials rotated in decade related proportions in response to the rotations of the shafts 36 and 40, respectively. Thus, the dial pointer 34 provides the low order indication of a set of total kilowatthour dial indications and the dial pointer 38 provides the low order indication of a set of on-peak kilowatthour dial indication.

A first or input gear train in the register 12 includes a gear 44 driven by the worm wheel 24 directly rotated by the measuring element 16. Rotation of the gear 44 is transmitted to the gears 46, 48, 50 and 52 of the first gear train. The gear 52 is fixed to the shaft 36 to directly and continuously couple the pointer 34 to the metering rotations of the measuring element 16. The rotations of the pointer shaft 36 are coupled to the higher order dial pointers of the set of total kilowatthour dials by a gear 54 and to a second gear train including a first gear 56 continuously coupling the rotations of the shaft 36 to the input of the clutch mechanism 14. The second gear train includes, in addition to the gear 56 which is fixedly carried by the shaft 36, the further gears 60, 62, 64 and 66. The gears of the second gear train continuously couple the rotations of the shaft 36 to the gear 66 to drive the clutch mechanism as described in detail hereinafter.

Figure 2:
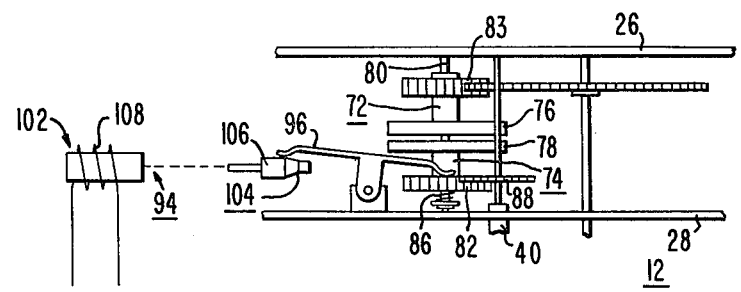
FIG. 2 is a fragmentary top plan view of a portion of FIG. 1 showing the improved clutch mechanism in a different operative position.
Figure 4:
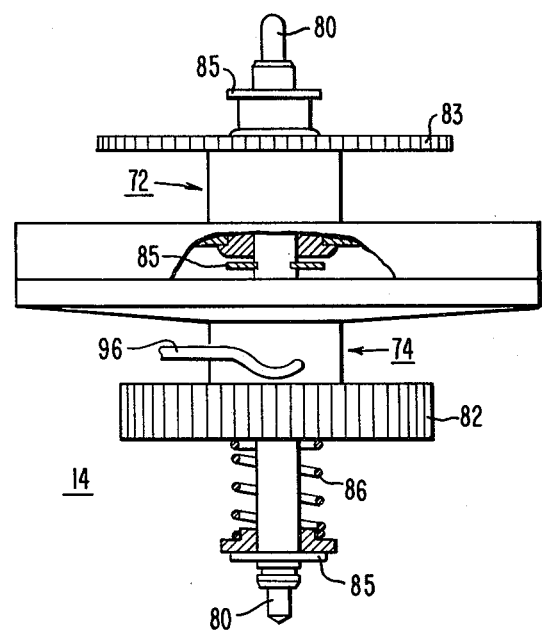
FIG. 4 is a separate side elevational view with parts removed of the clutch mechanism included in the register shown in FIGS. 1 and 2.

The clutch mechanism 14, also shown in the enlarged view of FIG. 4, includes an input or clutch driving part 72 and an output or clutch driven and brake part 74 and both are rotatable about a common axis of rotation formed by the straight shaft 80. The two clutch parts 72 and 74 are both mounted for free rotation and overriding relationships on the shaft 80 and have similar construction including clutch plates 76 and 78. Flat radially facing surfaces of the clutch plates 76 and 78 include frictional clutch surfaces extending radially from the stationary shaft 80 carried between the plates 26 and 28. Gears 83 and 82 are integrally connected with the clutch plates 76 and 78, respectively so that the gear and clutch plate of each of the clutch parts 72 and 74 rotate in unison about the shaft 80. The gear of each clutch part is staked in a integral relationship to the associated clutch plate in an axially spaced relationship as shown in FIGS. 1, 2 and 4. The clutch driving part 72 is restrained from axial movement upon the shaft 80 and prevented from axial movement in a conventional manner such as by the use of small retaining rings 85, as best seen in FIG. 4, mounted in grooves on the shaft 80. The clutch driven part 74 is axially slidable or shiftable on the shaft 80 to permit the engagement and disengagement of the clutch plates 76 and 78. A resilient clutch biasing member is provided by a helical coil spring 86 mounted in a compressed state between the gear 82 of the part 74 and a further one of the retaining rings 85 mounted in a groove an the shaft 80 adjacent the plate 28. The resilient reactive force of the compressed spring 86 biases the clutch part 74 toward the clutch part 72. Thus, in the biased together or closed position of the clutch mechanism 14, as shown in FIGS. 1 and 4, the mutually engaging frictional surfaces of the clutch plates 76 and 78 are pressed together by the spring 86 so that substantially no slippage occurs therebetween and the rotational torque provided by the part 72 is transmitted across the clutch surfaces to the clutch part 74.

The rotational input to the clutch mechanism 14 is provided by the gear 83 being in continuous meshing engagement with the gear 66 of the aforementioned second gear train. The rotational output of the clutch mechanism 14 is provided by the gear 82 having continually meshing engagement with a gear 88 of a third and intermittently operated gear train driving the on-peak pointer 38. The gear 82 has a width slightly greater than the extent of axial movement of the clutch part 74 so as to avoid gear tooth demeshing between the gears 82 and 88. The gear 88 has a fixedly attached relationship with the shaft 40 carrying the pointer 38. A further gear 90 of the third gear train is also fixedly attached to the shaft 40 to provide coupling to the higher order dial pointers of the set of on-peak kilowatthour dials. A braking feature is incorporated into the clutch mechanism 14 as is described hereinbelow and the braking feature has a cooperative relationship with a clutch operating arrangement 94 described further hereinafter.

The clutch operating arrangement 94 is provided by a trip lever or arm 96 mounted at a pivot 98 carried by the plate 28 of the register 12, as shown in FIGS. 1 and 2. The right-hand or driven end of the lever arm 96 has a fork configuration defining tines extending over the cylindrical sleeve connecting the clutch plate 78 and the gear 82 so that the ends of the tines are releasably engageable with the back or inner radial surface of the gear 82. The left-hand or driving end of the lever arm 96 is swingingly rotated by a solenoid actuator 102 including a reciprocally movable cam 104 carried by a plunger armature 106. The armature 106 is reciprocally movable so that an increasing diameter or frustoconical camming surface of the cam 104 and a smaller straight diameter surface thereof move the left-hand or driven end of the lever arm 96 arcuately clockwise and counterclockwise, respectively as viewed in FIGS. 2 and 1. The solenoid actuator 102 includes an electromagnetic coil 108 which is energized by suitable electrical signals indicated by the directional arrow 110 in FIG. 1. In the deenergized state the armature is mechanically biased to the position shown in FIG. 2. The absence of the electric signals 110 results in the armature 106 being biased to an extended and right-hand most position as shown in FIG. 2 and the presence of the signals 110 effects the retracted and left-hand most position of the armature 106 as shown in FIG. 1. The clutch closed position is produced by the armature 106 being electromagnetically shifted to the left or retracted position so that the lever arm 96 assumes a counterclockwise rotated position to be released from the side of the gear 82 of the clutch part 74 as shown in FIG. 4. The spring 86 is then permitted to bias or urge the clutch driving and driven parts 72 and 74 together so that the rotations of the first and second gear trains are transmitted through the clutch mechanism 14 to the third gear train and the pointer 38. Thus, the rotations of the measuring element 16 are transmitted to the shaft 40 and the pointer 38 and the remaining pointers, partially shown, of the on-peak kilowatthour set of dials. The clutch open position and uncoupling condition is illustrated in FIG. 2 when the armature 106 is shifted to the right and extended position. The lever arm 96 assumes a clockwise most rotated position to drive the side of the gear 82 and the clutch part 74 axially forward so that the clutch part 74 further compresses the spring 86 and is spaced from the clutch driving part 72. The mutually engaging clutch friction surfaces of the clutch plates 76 and 78 are disengaged and released from each other so that the torque of the clutch part 72 is not coupled to the clutch part 74. In the clutch open position the clutch part 72 idles on the shaft 80 presenting low or negligible torque on the first and second gear trains and the measuring element 16.

To provide a braking or rotation locking and arresting feature in the clutch mechanism 14, the frictional engagement of the right-hand or driven end of the lever arm 96 and the radial side of the gear 82 when the lever arm is rotated to the clutch open position, prevents rotation of the clutch part 74. The spring 86 biases the side of the gear 78 against the fork ends of the lever arm 96 with a stronger force than is applied across the clutch plate engaging surfaces because of the increased compression of the gear 82. The spring biasing force provides a strong frictionally locking force clamping the gear 82 to the end of the lever arm 96 to rotationally retain the clutch part 74. Arresting the rotation of the clutch part 74 holds the gear 82 substantially stationary and, in turn the gear 88, shaft 40 and the pointer 38 and the other pointers of the on-peak set of kilowatthour dials. Thus, movement of the pointer 38 and the gear 90 prevents wandering or spurious movements of the pointer indicators of the on-peak kilowatthour dials during the non-measuring or off-peak periods thereof when the dial pointers are in a non-indicating state or condition.

The operation of the clutch mechanism 14 in a time-of-day or on-peak and off-peak mode of kilowatthour electric energy metering operation provides the coupling and uncoupling of the rotations of the measuring element 16 from the pointer shaft 40 which drives the on-peak kilowatthour dial pointers. The pointer shaft 36 of the total kilowatthour dial pointers is continuously coupled to the measuring element 16 so that the total kilowatthour dials give the calibrated measuring indications of the total accumulation of rotations of the measuring element 16 in either the on or off-peak modes. Thus, the total kilowatthours and on-peak kilowatthours are directly readable from the dial plate 32 of the register 12. The off-peak kilowatthours of electric energy consumption is simply determined by calculating the difference between the indications of the total and the on-peak kilowatthours of consumption.

Typically, the predetermined times of day for measuring the on-peak consumption is made to coincide with the peak demand periods of an electric utility supplying the electric energy via conductors 22 and 23 and being measured by the meter 10. The presence or absence of a locally or remotely generated signal 110 produces either the on-peak or off-peak modes of operation. When the solenoid actuator 102 is electrically operated to shift the cam 104 to the retracted position as shown in FIG. 1, the lever arm 96 is swingingly rotated so that the driven end thereof is released from the side of the gear 82 and the clutch part 74 is biased by the spring 82 to effect pressure against the clutch part 72. The clutch closed position of the clutch mechanism 14 couples the rotations of the measuring element 16 from the first gear train, the pointer shaft 36, the second gear train, and across the input and outputs of the clutch mechanism 14 to the pointer shaft 40 and the pointer indicator 38 and the other pointers of the on-peak dials. When the clutch parts 72 and 74 are rotating in unison on the shaft 80, there is negligible or low amounts of mechanical loading or torque applied to the gear trains of the register 12 or to the measuring element 16 by the clutch mechanism 14 to produce the measuring movement of the pointer shaft 40. The driven end of the lever arm 96 is free of interference with the side of the gear 82 when the clutch mechanism 14 is in its closed position so that the pointer shaft 40 is free of the braking action produced in the clutch mechanism 14 during the off-peak mode.

When it is desired to open the clutch mechanism 14 to end the predetermined period of on-peak electric energy measuring, the solenoid actuator 102 is electrically deenergized as shown in FIG. 2. The armature 106 and cam 104 are extended and the larger diameter cam surface urges the lever arm 96 in the clockwise direction to cause the clutch part 74 to be shifted forward and be released from the clutch part 72. The clutch open position is effected with the clutch part 72 being spaced and uncoupled from the clutch part 74 so that the part 72 continues to be rotated but independent of the part 74 in response to the rotations of the measuring element 16. The independent rotation of the clutch part 72 is made without any appreciable mechanical loading or torque being applied to the first and second gear trains of the register 12 or the measuring element 16 due to the clutch open condition of operation. The forward shifting of the clutch part 74 by the lever arm 96 causes it to be biased strongly against the side of the gear 82 by the action of the enlarged diameter section of the cam 104 and the reaction force of the spring 86. The frictional and clamping forces between the driven and bifurcated end of the lever arm 96 and the side of the gear 82 arrest any tendency for rotation thereof. Since the gear 82 is held in a braked or locked condition, the gears 88 and 90, the pointer shaft 40 and the pointer 38 are prevented from moving when the clutch mechanism 14 is open. No erroneously indicating movement of the shaft 40 is permitted during the clutch open position and therefore no erroneous indications will be made on or at the on-peak kilowatthour dials.

A preferred embodiment of the clutch mechanism 14 has been described hereinabove in accordance with the present invention and it is contemplated that other obvious alternatives and equivalents which are understood by those skilled in the art may be employed without departing from the spirit and scope of this invention.

We claim:

1. A meter dial register for indicating both continuous and periodic accumulated values of a measured quantity, said meter dial register comprising:
   a rotatable measuring element for rotating at a rate corresponding to the consumption of the measured quantity;
   first and second gear trains both continuously coupled to the rotations of said measuring element;
   a first dial pointer coupled in continuously driven relationship with said first gear train for indicating the continuous accumulated values of the measured quantity;
   a friction clutch driving part being coupled in continuously driven relationship with said second gear train and being freely rotatable at a restrained axial position about a predetermined axis of rotation;
   a friction clutch driven and brake part being rotatable about said predetermined axis of rotation and further being axially shiftable between an open position spaced from said friction clutch driving part and a closed position engaging said friction clutch driving part for effecting common rotation therewith;
   clutch operating means for shifting said friction clutch driven and brake part between said open and said closed positions and further for arresting said friction clutch driven and brake part when shifted by said operating means to said open position;
   a third gear train continuously coupled in driven relationship with said friction clutch driven and brake part; and
   a second dial pointer coupled in continuously driven relationship with said third gear train for indicating the periodically accumulated values of the measured quantity.

2. The meter dial register as claimed in claim 1 wherein said friction clutch driven and brake part and said friction clutch driving part each include clutch plates mutually engageable with each other at radial friction surfaces and wherein each part further includes a gear member separately coupled to said second and said third gear trains, respectively.

3. The meter dial register as claimed in claim 2 wherein said friction clutch driven and brake part and said friction clutch driving part each include said gear member thereof axially spaced from the associated clutch plate thereof.

4. The meter dial register as claimed in claim 3 wherein said clutch operating means includes a lever arm pivotally mounted in said register so that one end of said lever arm has swinging movements within the axial space between the clutch plate and gear member of said friction clutch driven part to effect said open position and to arrest rotation thereof when in said open position.

5. The meter dial register as claimed in claim 4 wherein said clutch operating means includes spring means biasing said friction clutch driven and brake part toward said friction clutch driving part and said one end of said lever arm so as to resist rotation thereof when in said open position.

6. The meter dial register as claimed in claim 5 wherein said clutch operating means includes a solenoid means having a reciprocally movable armature actuating the other end of said lever arm for producing the swinging movement at said one end such that when the clutch open position is effected said gear member of said friction clutch driven and brake part is clamped between said spring means and said one end of said lever arm.

* * * * *